United States Patent [19]

Kamoshida et al.

[11] Patent Number: 4,816,126
[45] Date of Patent: Mar. 28, 1989

[54] METHOD FOR FORMING A PLANARIZED THIN FILM

[75] Inventors: Kazuyoshi Kamoshida, Isehara; Hiroaki Nakamura, Fujisawa; Takao Amazawa, Atsugi, all of Japan

[73] Assignee: Nippon Telegraph and Telephone Corporation, Tokyo, Japan

[21] Appl. No.: 75,208

[22] Filed: Jul. 20, 1987

Related U.S. Application Data

[63] Continuation of Ser. No. 862,826, May 13, 1986, abandoned.

[30] Foreign Application Priority Data

May 13, 1985 [JP] Japan ................... 60-99505
Sep. 20, 1985 [JP] Japan ................... 60-209741

[51] Int. Cl.$^4$ .............................................. C23C 14/34
[52] U.S. Cl. .............................. 204/192.3; 204/192.15; 204/192.35
[58] Field of Search ........... 204/192.1, 192.12, 192.15, 204/192.3, 192.32, 192.35, 298

[56] References Cited

U.S. PATENT DOCUMENTS

| | | | |
|---|---|---|---|
| 3,451,912 | 6/1969 | D'heurle et al. | 204/192 EC |
| 3,661,761 | 5/1972 | Koenig | 204/192 EC |
| 3,868,723 | 2/1975 | Lechaton et al. | 204/192 EC |
| 3,983,022 | 9/1976 | Auyang et al. | 204/192 EC |
| 4,007,103 | 2/1977 | Baker et al. | 204/192 EC |
| 4,035,276 | 7/1977 | Havas et al. | 204/192 EC |
| 4,336,118 | 6/1982 | Patten et al. | 204/192 EC |

OTHER PUBLICATIONS

H. P. Bader et al., "Planarization . . . Simulation", J. Vac. Sci. Technol., Nov./Dec. 1987, pp. 2167–2171.
Ting et al., "Study . . . SiO$_2$", J. Vac. Sci. Technol. vol. 15, No. 3, May/Jun. 1978, pp. 1105–1112.
"Y. H. Park et al., Influence of D.C. Bias on Aluminum Films Prepared with a High Rate Magnetron Sputtering Cathode Thin Solid Films 129" (1985), 309–314.
J. Electrochem. Soc. Solid–State Science and Technology, Jun. 1985,—pp. 1466–1472.

*Primary Examiner*—John F. Niebling
*Assistant Examiner*—Nam X. Nguyen
*Attorney, Agent, or Firm*—Cushman, Darby & Cushman

[57] ABSTRACT

Charged particles are irradiated over a thin film formed on a convex and concave surface of a substrate or over a thin film being formed on a convex and concave surface of a substrate. During the irradiation, raise in temperature of the thin film and impingement of charged particles cause the fluidization of the thin film, so that a planarized thin film is formed within a short period of time.

11 Claims, 21 Drawing Sheets

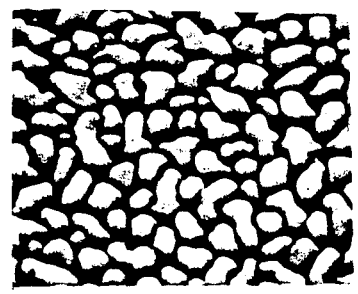
1.0 μm
F I G. 3
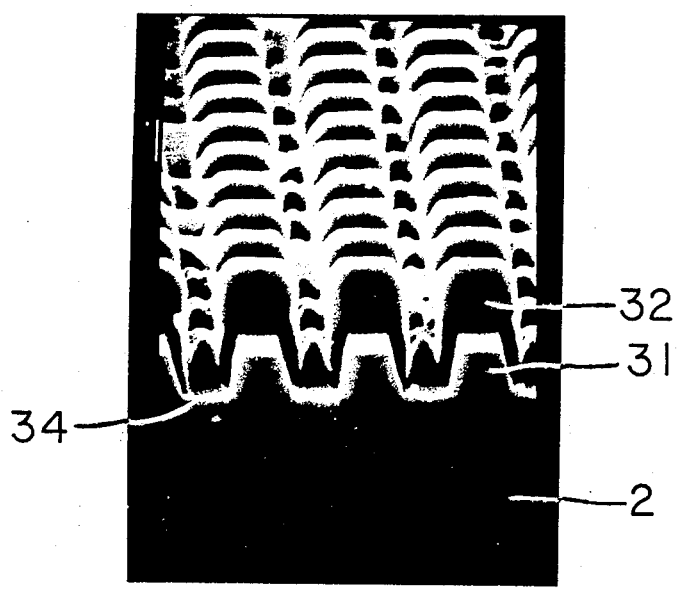
F I G. 11

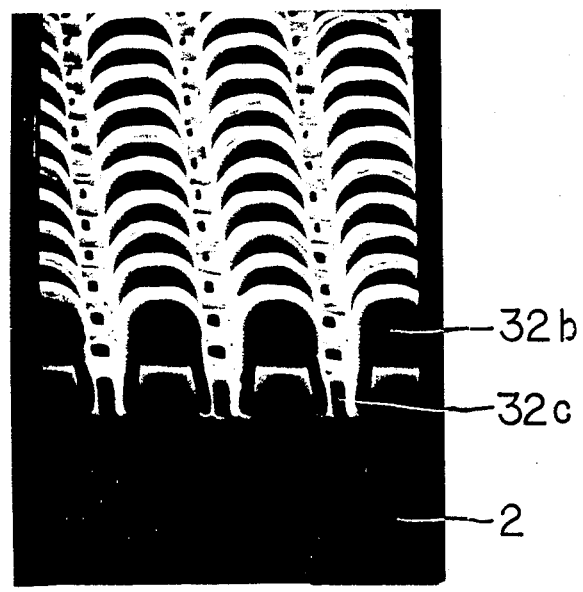
F I G. 9C
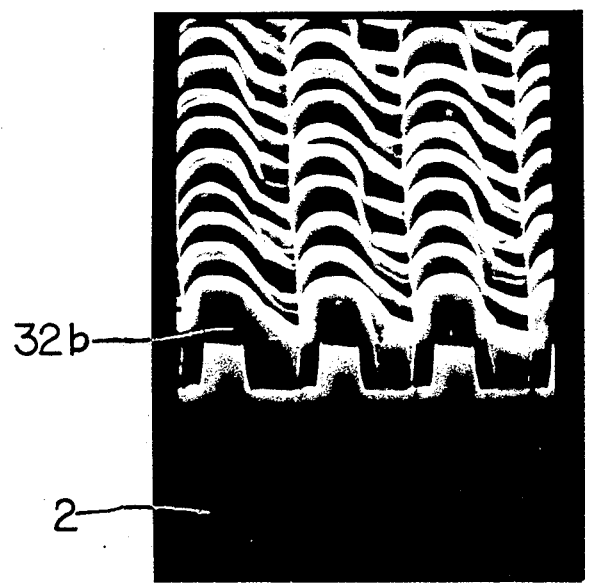
F I G. 9D

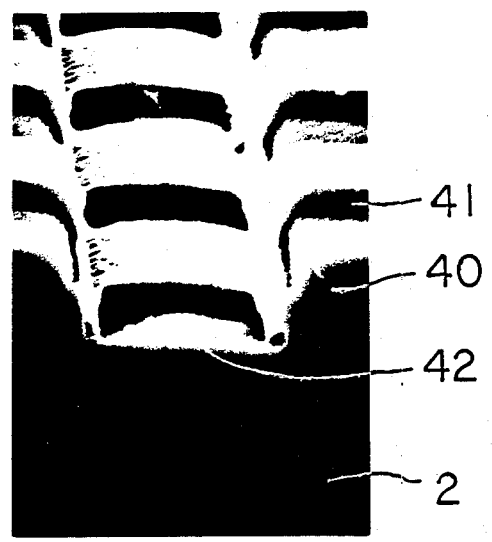
F I G. 12A
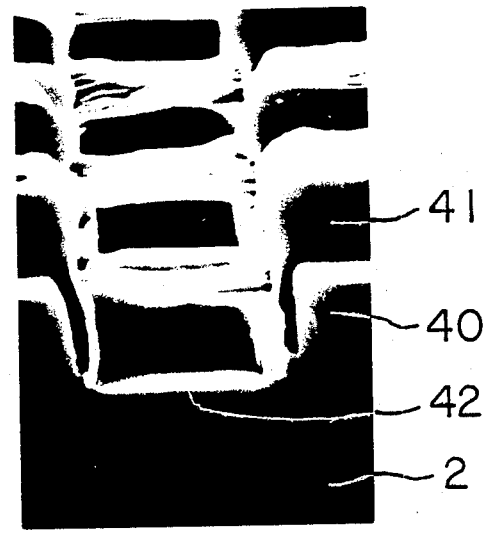
F I G. 12B

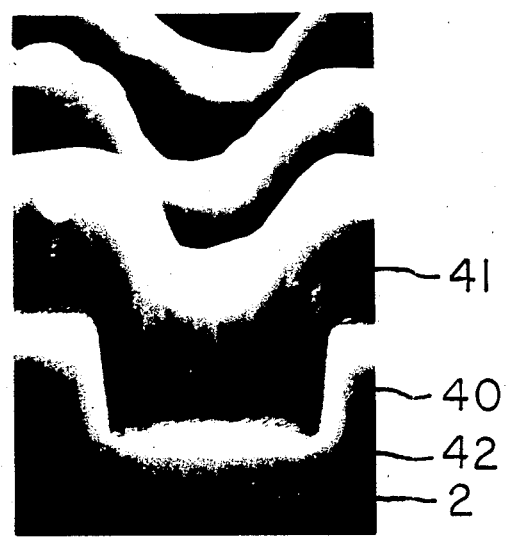
F I G. 12C
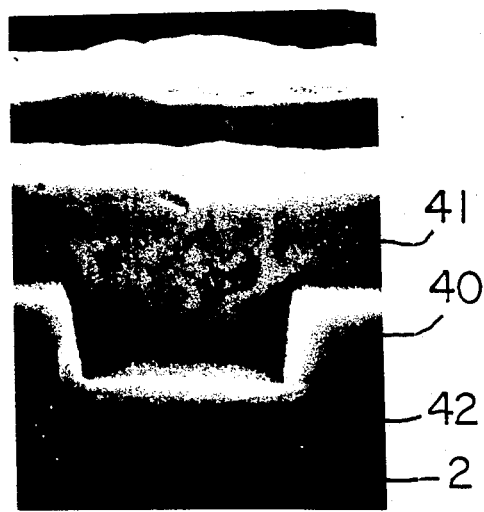
F I G. 12D

METHOD FOR FORMING A PLANARIZED THIN FILM

This is a continuation of application Ser. No. 862,826, filed May 13, 1986, which was abandoned upon the filing hereof.

BACKGROUND OF THE INVENTION

1. Field of the Invention

The present invention relates to a method for forming a thin film which is used as conductor in a semiconductor integrated circuit and more particularly to a method for forming a planarized thin film over an undercoat film having a rough surface which is not planarized.

2. Description of the Prior Art

So far, a vacuum evaporation or sputtering process has been widely used to form a thin metal film which is used as conductor in a semiconductor integrated circuit. However, the surfaces of a substrate over which thin metal films are formed are generally not planar, but are rough. That is, the surfaces have small ridges and valleys or are convex and concave. As a result, when a thin film is formed over the rough surface of such a substrate by the vacuum evaporation or sputtering process, a shape of a thin film covering the rough surface is deteriorated. For instance, an overhanging thin film is formed at a ridge so that a micro-crack occurs at a step of the ridge to result in a wiring breakdown such as disconnection.

In order to solve the above-described problems, it is required that a thin metal film completely fills ridges and valleys of the substrate to planarize the rough surface of the substrate as much as possible. In order to satisfy the above-described requirement, we can consider the following two processes. One process is such that after a thin metal film has been formed over a rough surface of a substrate to poorly cover the rough surface, defective portions of the thin metal film thus poorly covering the rough surface are remedied by some methods. The other process is such that a planarized thin film is so formed that its planarized surface covers uniformly the rough surface.

However, there has not been proposed yet the former process which is satisfactory in practice. As the latter process, there is a technique which is a so-called "bias sputtering method" such as a proposal by Homma et al. in Journal of Electrochemical Society, Vol. 132, (1985), pp. 1466-1472, "Planar Deposition of Aluminum by RF/DC Sputtering with RF Bias". In the bias sputtering method, a material of a thin film is sputtered to form a thin film over the rough surface of a substrate under a condition that a DC or AC bias voltage such as a voltage in a range of $-100$ V through $-500$ V is applied to the substrate According to the conventional bias sputtering method, the formation of a thin film proceeds while a part of the thin film deposited over the substrate is being etched out.

That is, as shown in FIG. 1, the bias sputtering method utilizes the fact that an etching rate of a thin film is dependent upon an ion incident angle in order to planarize the surface of the deposited thin film, as will be described in detail hereinafter.

The planarization process will be explained in detail with referring to FIGS. 2A-2E. While a thin film formation period is short, an unsatisfactory Al film 101 with poor planarization is formed over a substrate 100 having convex portions 102 as shown in FIG. 2A. Thereafter, in a little while, the inclined surfaces of the Al thin film 101 are etched faster than the horizontal surfaces thereof, and at the same time, Al is deposited over the inclined and horizontal surfaces, so that the covering shape of the thin film being deposited varies as shown in FIGS. 2B and 2C. When the formation of the thin film is further carried out, the etching rate at the inclined surfaces is faster than that at the horizontal surfaces parallel to the surface of the substrate 100, so that the inclined surfaces recede toward the middle portions of the projections 102, as shown in FIG. 2D. In this case, while the deposited thin film is etched, a new thin film is formed by the deposition of sputtered atoms flying from a target, so that the thickness of the thin film 101 is not so extremely thin. As the time further elapses, the inclined surfaces over the projections 102 further recede toward the middle portions of the projections 102 and finally the inclined surfaces which are receding from both sides disappear at the midddle portions of the projections 102, so that the thin film 101 has a planarized surface, as shown in FIG. 2E.

The above-described bias sputtering method, however, has the following fatal defects.

Firstly, the rate at which a new thin film is formed by the deposition of sputtered atoms from the target must be lower than the rate at which the inclined surfaces recede or disappear, so that a planarized surface is obtained. As a result, there arises the problem that it takes a long time before the surface of the thin film is fully planarized. According to a conventional magnetron sputtering process, the deposition rate of aluminum is about 1 $\mu$m/min, while according to the above described bias sputtering process, the deposition rate is about 20 nm/min. That is, the deposition rate of the bias sputtering process is 50 times as slow as the deposition rate of the magnetron sputtering process.

Secondly, as is clear from the above-described explanation with reference to FIGS. 2A-2E, when the width of a projection is narrow, the surface of a thin film can be planarized within a relatively short time, but when the width of a projection is wide, it takes a longer time before the surface of a thin film deposited is planarized. As a result, when the surface pattern of an undercoat or substrate has projections in various sizes, the thickness and the shape of a thin film deposited over the undercoat or substrate are dependent upon the surface pattern of the undercoat or substrate. More particularly, the thickness of the thin film varies from one pattern projection to another and the surface on a large pattern projection is not sufficiently planarized. Due to this dependency of the surface of the thin film on the surface pattern of the substrate, the thin film remains partially unetched in the succeeding etching step, so that a yield of the finished product becomes low.

In addition, according to the bias sputtering process, accelerated ions are made to impinge against a surface of a substrate, so that sputter etching proceeds at the same time that a thin film is deposited over the surface of the substrate. As a result, during the initial time that a thin film is not sufficiently deposited over the surface of the substrate, the elements of the substrate which have been sputter-etched are mixed into the thin film being deposited and accelerated ions are also injected into the thin film, so that a purity of the deposited thin film is lowered. When ions are impinged against the substrate surface with a higher acceleration energy, the structure of the deposited thin film is varied and accordingly a high-quality thin film cannot be formed continuously.

FIG. 3 is a photograph taken by a scanning type electron microscope, illustrating the surface condition when a thin aluminum film is formed over the surface of an $SiO_2$ film by the bias sputtering process with a higher acceleration energy. It is seen that the crystal grain growth of aluminum is adversely restrained by oxygen and silicon emitted from the substrate so that column crystals in which crystal grains are spaced apart from each other are grown. As a result, the aluminum film thus deposited exhibits infinite resistance.

Because of the defects described above, the bias sputtering process has not been satisfactorily used in practice to form a thin metal film.

SUMMARY OF THE INVENTION

In view of the above, one of the objects of the present invention is to provided a novel method for forming a planarized thin film which covers a convex and concave surface of a substrate with a good covering shape and has a planarized surface at a high rate.

Another object of the present invention is to provide a method for forming a well planarized thin film with a good covering shape over the patterned surface of the substrate independently of the surface pattern thereof.

A further object of the present invention is to provide a method for forming a planarized thin film which is high both in quality and purity.

A yet further object of the present invention is to provide a method for forming a thin metal film which has a low resistance, excellent crystal properties and a high degree of mirror surface properties.

A still further object of the present invention is to provide a method for forming a planarized thin film without causing any damage on the surface of a substrate.

A still further object of the present invention is to provide a method for forming a planarized thin film preferably adapted to define a conduction layer in a VLSI of the order of less than one micron meter in width.

To the above and other ends, according to the present invention, charged particles are irradiated over a thin film formed on a convex and concave surface of a substrate or over a thin film being formed on a convex and concave surface of a substrate. During the irradiation, raise in temperature of the thin film and impingement of charged particles cause the fludization of the thin film, so that a planarized thin film is formed within a short period of time.

The present invention is based upon the fludization phenomenon of aluminum or Al discovered when the inventors conducted extensive studies and experiments of the aluminum sputtering process and is, therefore, quite different in principle from the prior art bias sputtering process utilizing the etching phenomenon.

According to another aspect of the present invention, after elements of a target are deposited without irradiating charged particles to a substrate until a continuous film is formed by the deposition, a sputter deposition is carried out while charged particles are being irradiated to the substrate.

More particularly, first elements of the target are deposited on the substrate without irradiating charged particles. The film thus deposited consists of high purity target elements without contamination of the elements of the substrate. Thereafter, while charged particles are being irradiated to the substrate, the sputter deposition is carried out. In this case, the deposited film is subjected to the etching process, so that there seems to be the possibility that the composition materials are mixed into a newly formed film, but the purity of a newly deposited film is not decreased, since the deposited film itself consists of a high purity target material. In addition, in the case of the above-described method, the surface of the substrate is prevented from being directly impinged by the ions, so that no damage is caused on the substrate.

In the first aspect of the present invention, a method for forming a planarized thin film, comprises the steps of:

forming a thin film on a substrate having a non-planarized surface; and irradiating charged particles over the thin film so that the thin film is fluidized by a temperature rise of the thin film and bombardment of the thin film with the charged particles.

Here, the thin film may be an aluminum film. The charged particles irradiating the thin film may be accelerated by a bias voltage whose absolute value is higher than $|-850|$ volts. A temperature of the thin film may be lower than a melting point of the thin film.

After the formation of the thin film on the substrate having the non-planarized surface, the charged particles may be irradiated on the thin film after the substrate has been heated from the exterior or while the substrate is being heated from the exterior.

A temperature of the thin film in case of the irradiation with the charged particles and the heating from the exterior may be lower than a melting point of the thin film.

In the second aspect of the present invention, a method for forming a planarized thin film on a substrate having a non-planarized surface, the method comprises the steps of:

irradiating charged particles on the thin film which is being formed; and forming the thin film while fluidizing the thin film by a temperature rise of the thin film and bombardment of the thin film with the charged particles.

Here, the thin film may be an aluminum film. The charged particles irradiating the thin film may be accelerated by a bias voltage whose absolute value is higher than $|-700|$ volts. A temperature of the thin film may be lower than a melting point of the thin film.

The substrate may be heated from the exterior when the thin film is formed on the substrate having the non-planarized surface.

A temperature of the thin film in case of the irradiation with the charged particles and the heating from the exterior may be lower than a melting point of the thin film.

In the third aspect of the present invention, a method for forming a planarized thin film, comprises:

a first step of forming a first thin film on a substrate having a non-planarized surface; and a second step of forming a second thin film on the first thin film while irradiating on the second thin film being formed with charged particles during the formation of the second thin film.

Here, a thickness of the first thin film deposited in the first step may be so determined that the first thin film is not deposited in the form of islands but is deposited as a continuous film.

The charged particles may be irradiated against the second thin film being formed when the second thin film is formed in the second step, and the second thin film may be formed while the second thin film is fluidized by a temperature rise of the thin film and bombardment of the thin film with the charged particles.

The thin film may be an aluminum film. The charged particles irradiating the thin film may be accelerated by a bias voltage whose absolute value is higher than $|-700|$ volts. A temperature of the thin film may be lower than a melting point of the thin film.

The substrate may be heated from the exterior in the second step.

A temperature of the thin film in case of the irradiation with the charged particles and the heating from the exterior may be lower than a melting point of the thin film.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 3 is a photograph taken by a scanning type electron microscope and illustrating the surface of an aluminum film formed on an $SiO_2$ substrate by the conventional bias sputtering process;

FIGS. 8A-8C and FIGS. 9A-9E are photographs illustrating bias voltage and irradiation time dependence of coating conditions of aluminum films formed in accordance with a first embodiment of the present invention;

FIG. 11 is a photograph illustrating the coating conditions of an aluminum film deposited over the top surface of a substrate when charged particles are irradiated to the bottom surface of the substrate;

FIGS. 12A-12D are photographs illustrating the coating conditions of the aluminum films deposited in accordance with a second embodiment of the present invention;

DETAILED DESCRIPTION OF PREFERRED EMBODIMENTS

Prior to the description of embodiments of the present invention, an example of an apparatus adapted to carry out the present invention will be described with reference to FIG. 4.

Figure 1:
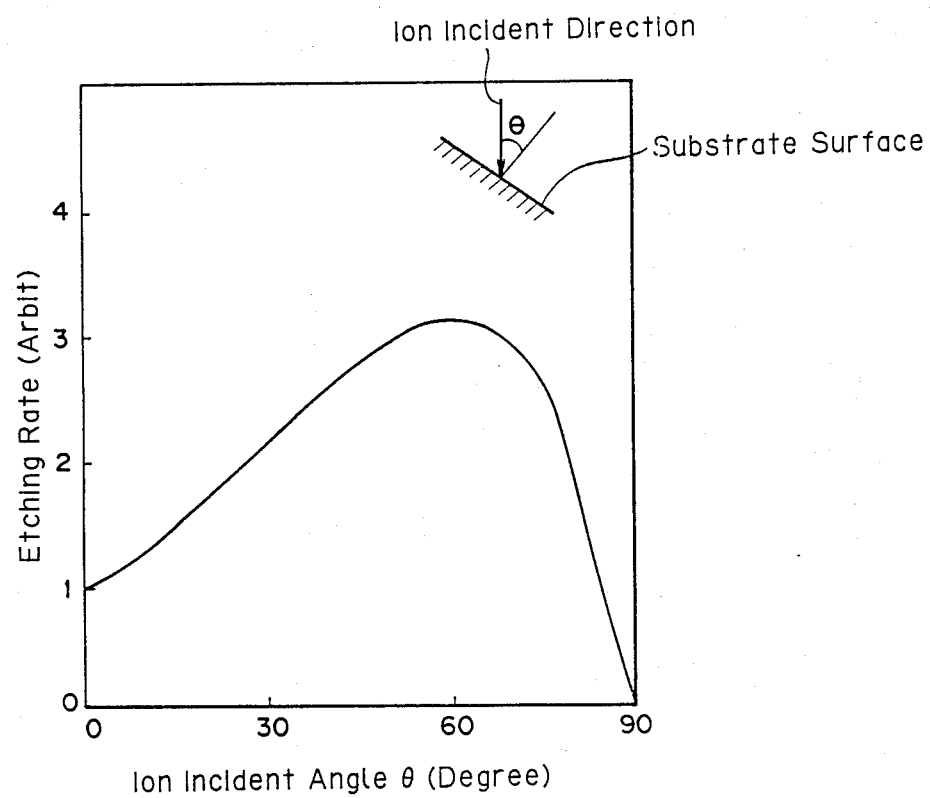
FIG. 1 is a diagram used to explain the underlying principle of a conventional bias sputtering process.
Figure 2A:
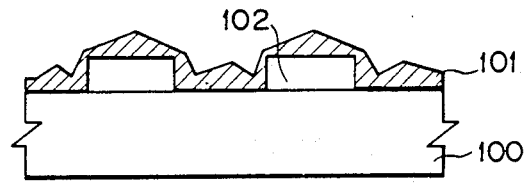
FIGS. 2A-2E are cross sectional views showing sequential steps of the conventional bias sputtering process.
Figure 2B:
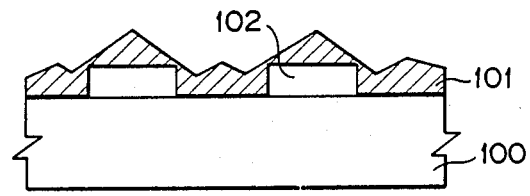
Figure 2C:
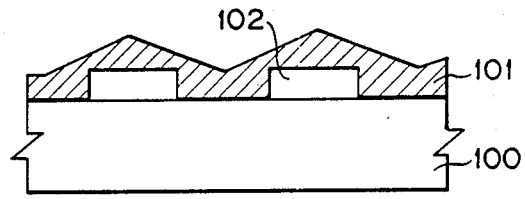
Figure 2D:
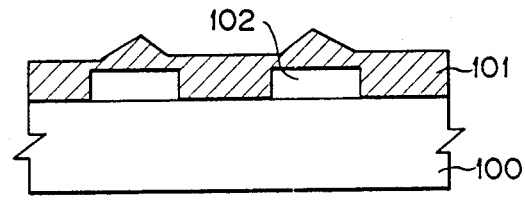
Figure 2E:
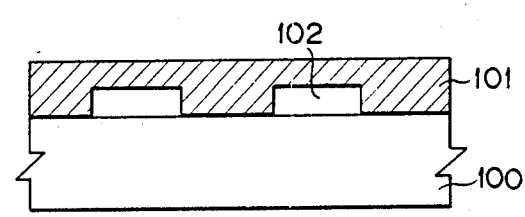
Figure 4:
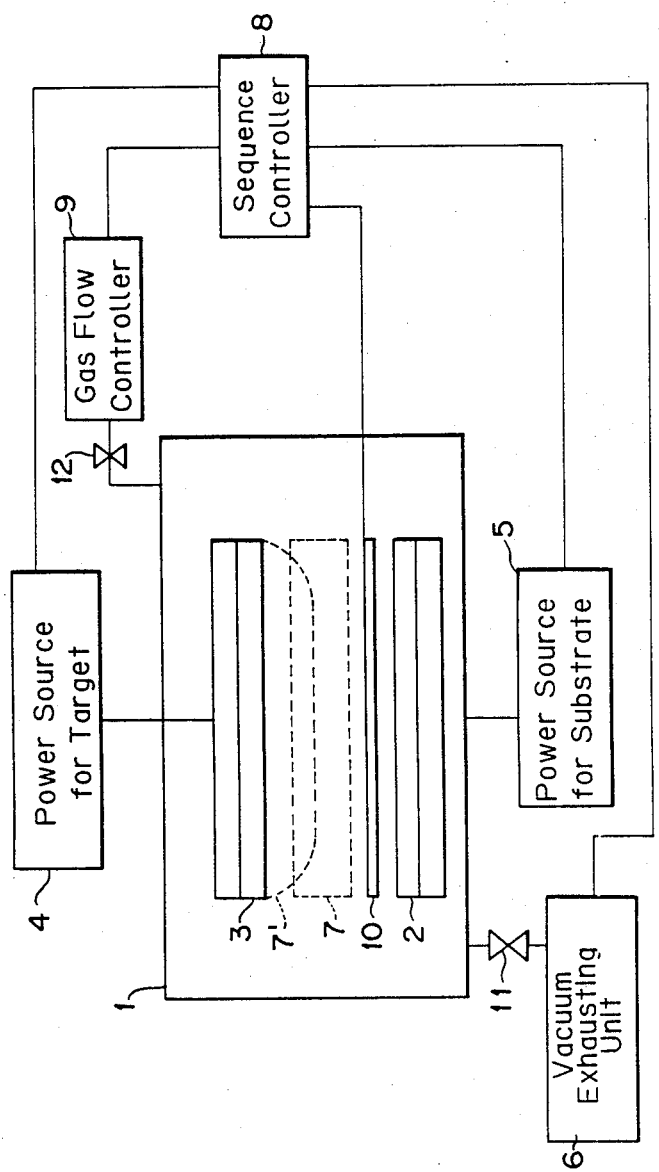
FIG. 4 is a schematic view showing an apparatus used to carry out the present invention.

In FIG. 4, a substrate 2 and a target 3 are disposed in opposed relationship with each other within a vacuum chamber 1. A target power supply 4 electrically connected to the target 3 may be a DC or RF power supply. A substrate power supply 5 electrically connected to the substrate 2 may be a DC or RF voltage generator. The target power supply 4, the substrate power supply 5, a vacuum exhausting unit 6 for evacuating the vacuum chamber 1, a gas controller 9 for controlling the flow rate of a gas to be supplied into the vacuum chamber 1 and a shutter 10 interposed between the substrate 2 and the target 3 are controlled to be energized or interrupted by the control signals from a sequence controller 8. Valves 11 and 12 are provided between the vacuum exhausting unit 6 and the vacuum chamber 1 and between the gas flow controller 9 and the vacuum chamber 1 to control vacuum condition of the vacuum chamber 1 and the gas flow into the vacuum chamber 1, respectively.

Figure 5:
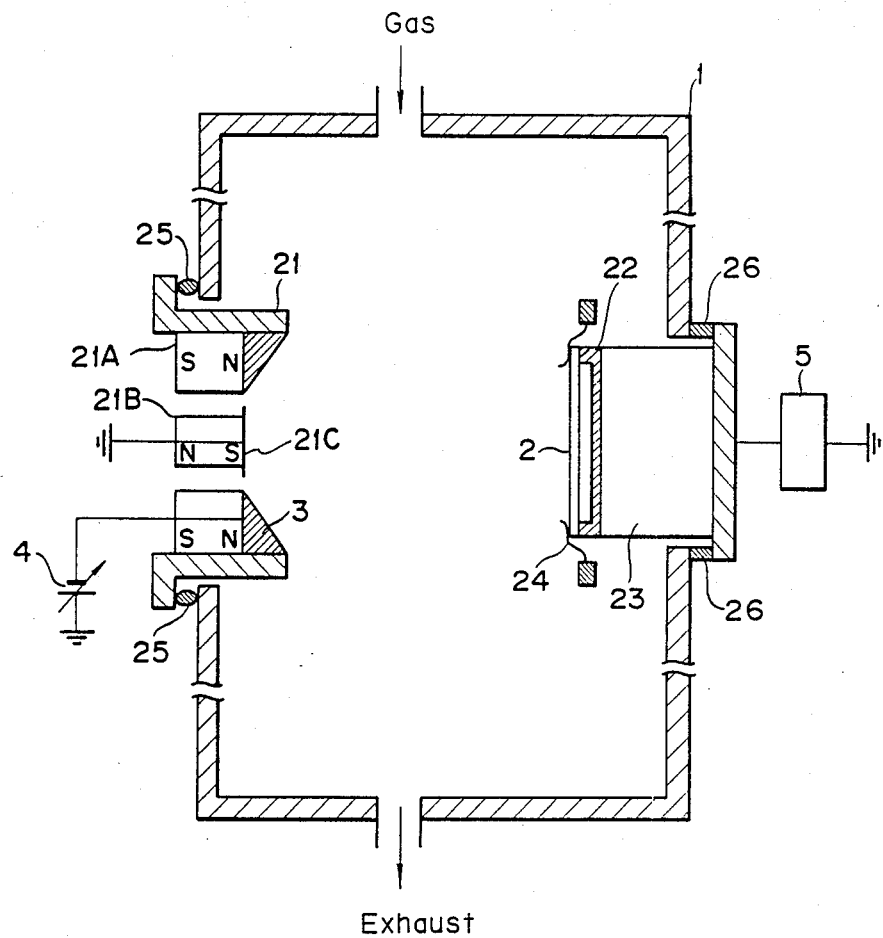
FIG. 5 is a sectional view showing a detail of a target and a substrate thereof.
Figure 6:
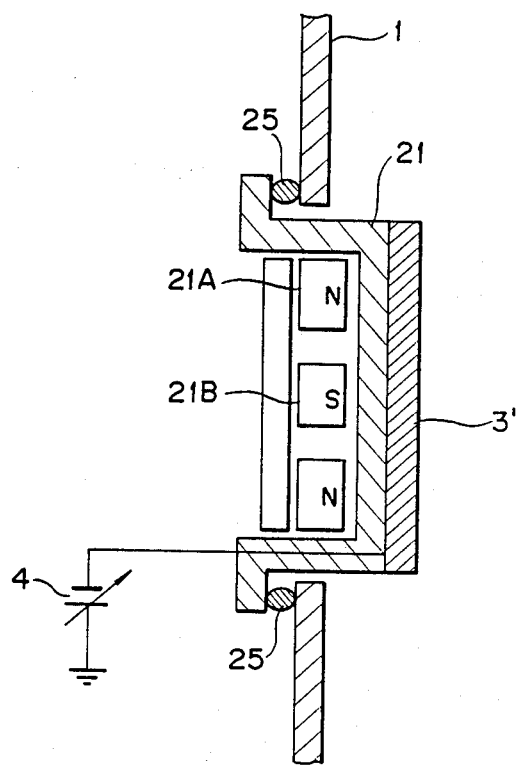
FIG. 6 is a cross sectional view showing a modification of a sputtering gun shown in FIG. 5.

FIG. 5 shows in detail the substrate 2, the target 3 and their associated parts, but does not show the detail of the vacuum chamber 1 and a gas supply line and an exhaust line communicating therewith. A cylindrical magnet 21A is fitted into a sputter gun 21 and a magnet 21B is disposed in the cylindrical magnet 21A in coaxial relationship therewith in such a manner that the magnetic poles of the cylindrical magnets 21A and 21B are opposite to each other as shown in FIG. 5. An electrode 21C is attached to the inner end of the magnet 21B within the vacuum chamber 1 and is grounded. The target 3 is attached to the inner end of the magnet 21A within the vacuum chamber 1. The target 3 is, for example, made of aluminum and is tapered radially inwardly. For instance, the outer diameter of the target 3 is about 18 cm and the area of the target surface is about 200 $cm^2$. The target 3 is connected to the power supply 4 in such a way that a negative potential is applied to the target 3 from the power supply 4. Since the sputter gun 21 has the coaxial magnets 21A and 21B as described above, the plasma for sputtering the target 3 is produced only around the target 3. A susceptor 22 supported by a substrate electrode 23 is disposed in opposed relationship with the sputter gun 21 and is spaced apart therefrom by about 8 cm and the surface area of the susceptor 22 is, for example, about 80 cm². The susceptor 22 has a peripheral flange about 1 mm in height which is extended inwardly to be made contact with the bottom surface of the substrate 2. The substrate electrode 23 is connected to the DC or AC bias power supply 5. Retainers 24 for retaining the substrate 2 in position are disposed around the susceptor 22 in such a manner that the substrate 2 is electrically isolated from the vacuum chamber 1. The sputter gun 21 and the substrate electrode 23 are gas-tightly attached to the vacuum chamber 1 by means of an O ring 25 and a sealing member 26, respectively. It should be noted that the sputter gun 21 may be a sputter gun structure having a flat target 3' as shown in FIG. 6.

When a thin film is deposited by using the apparatus shown in FIGS. 4 or 5, the substrate 2 is first mounted in the vacuum chamber 1 which is then evacuated by the vacuum exhausting unit 6. Thereafter a sputtering gas is introduced into the vacuum chamber 1 through the gas controller 9 so that the pressure in the vacuum chamber 1 is maintained at a predetermined level. As the sputtering gas an inert gas such as argon can be used in most cases. Next, the target power supply 4 is turned on. When the target 3 is of the two pole, parallel plate non-magnetron type sputter, a plasma 7 is generated between the target electrode 3 and the substrate 2. When magnets 21a and 21b are used in combination with the target electrode 3, a plasma 7' is generated in the vicinity of the target electrode 3. Due to the sputtering action caused by a bias generated between the target electrode 3 and the plasma 7 or 7', the element consisting the target electrode 3 is is sputtered. Under a condition that the shutter 10 is opened, the element of the target is deposited on the substrate 2.

Here, explanation will be made of effects when a bias voltage is applied to the substrate 2 from the bias power supply 5. If a negative DC or RF bias voltage is applied to the substrate 2, charged particles in the plasma 7 or a plasma newly generated by the bias voltage applied to the substrate 2 are accelerated by the bias voltage to impinge against the substrate 2. In this case, an acceleration energy of the charged particles irradiated to the substrate 2 is determined by the DC bias voltage in case of DC bias or a self bias voltage generated between the substrate 2 and the plasma in case of RF bias.

Next, a first embodiment of the present invention will be explained.

Figure 7A:
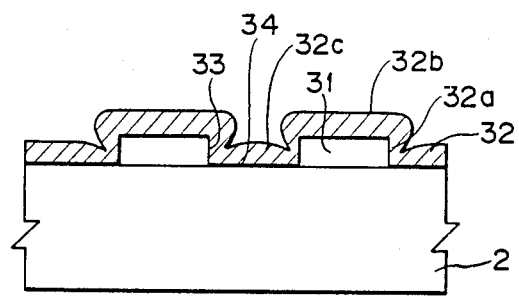
FIGS. 7A and 7B are cross sectional views illustrating sequential steps of a first embodiment of the present invention.
Figure 7B:
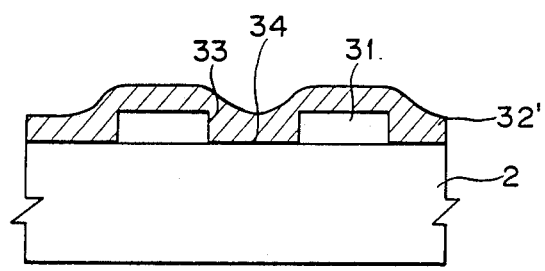

For example, as shown in FIG. 7A, a silicon oxide film is used as the substrate 2 having projections 31. An aluminum film 32 is formed on the substrate 2 by the sputtering process without applying any bias voltage to the substrate 2. Subsequently, an RF, for instance, 13.56 MHz voltage is applied from the power supply 5 to the substrate 2, so that the plasma is produced in the vacuum chamber 1. The charged particles (mainly ions) such as argon ions are caused to impinge against the aluminum film 32 on the substrate 32 to which the bias voltage is applied. As a result, the aluminum film 32 is fluidized, so that a planarized film 32' is obtained as shown in FIG. 7B.

Figure 8A:
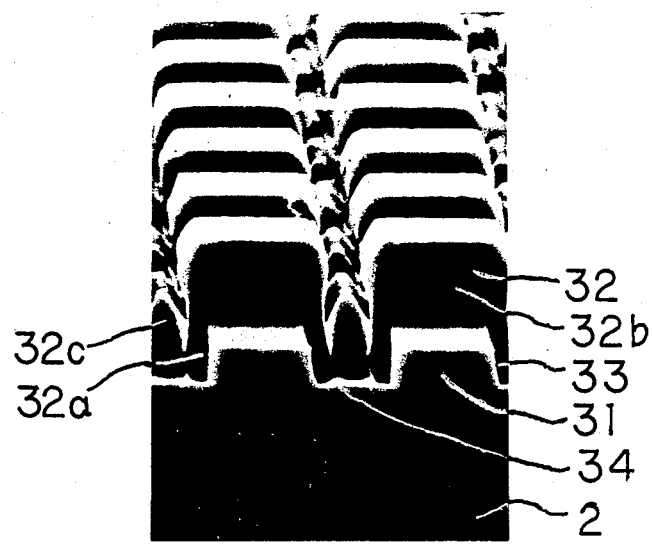

Next referring to FIGS. 8A–8C, actual variations in the coverage condition of the aluminum film in this case will be described. FIG. 8A is a perspective view corresponding to FIG. 7A and illustrating the coverage shape of the aluminum film 32 formed on the silicon oxide substrate having the projections 31 which were 2.5 μm in width, 1.0 μm in height and 4.5 μm in pitch, without applying a bias voltage to the substrate. The portion of the aluminum film 32 corresponding to the projection 31 had a thickness of 1.5 μm. The film formation time was 7.5 minutes.

The aluminum film 32a deposited on the side walls 33 of the projection 31 was extremely thin as compared with the aluminum film 32b deposited on the top of the projection 31 and the aluminum film 32c deposited on the bottom of the groove 34 between the projections 31 converged upwardly. As described above, the aluminum film 32 formed by the sputtering process without applying a bias voltage to the substrate 2 exhibited extremely bad coverage, because of reflecting the shadowing effect of the sputtering process.

Thereafter, a bias voltage was applied to the substrate 2 and the charged particles were irradiated over the surface of the aluminum film 32. Then, due to the application of the bias voltage, the aluminum film 32 was fluidized so that its coverage was considerably improved and consequently a planarized aluminum film 32' was formed. This process is shown in FIGS. 8A–8C.

In this case, the bias voltage means a self-bias voltage produced in the substrate electrode 23 (See FIG. 5) due to the generation of the plasma. The higher the power of the power supply 5, the higher the bias voltage becomes.

Figure 8B:
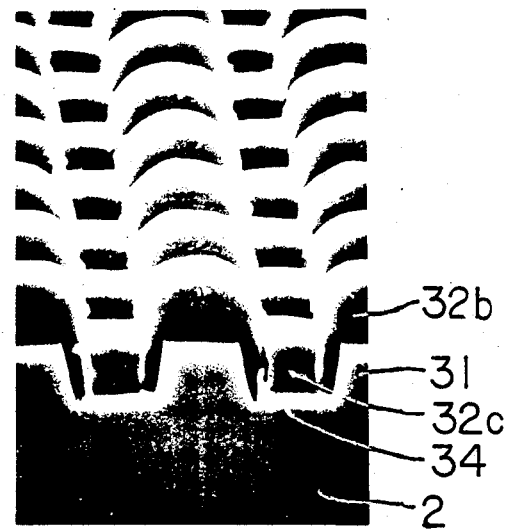

FIG. 8B shows the coverage of the aluminum film 32' formed by the processing for ten minutes when the bias voltage was −850 V (corresponding to 100 W power). When FIG. 8B is compared with FIG. 8A, it is seen that FIG. 8B shows the transition step in which both the edges of the aluminum film 32b deposited on the top of the projection 31 are rounded and the cross section of the aluminum film 32c deposited on the bottom of the groove 34 is varied due to fluidization, whereby the overall aluminum film is gradually planarized.

Figure 8C:
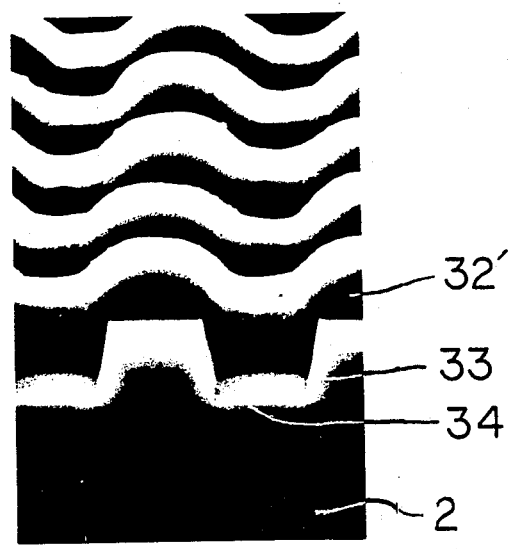

FIG. 8C shows the coverage of the aluminum film 32' formed by the processing for ten minutes when the bias voltage was −1200 V (corresponding to 220 W power). It is seen that the aluminum film 32' is fluidized to fill in the groove 34, so that the side walls 33 of the groove 34 are satisfactorily coated by the aluminum film 32' and consequently a degree of planarization of the deposited aluminum film is improved further.

FIGS. 9A–9E illustrate irradiation time dependence of the coating condition when charged particles are irradiated to the aluminum film with a bias voltage of −1400 V. In this case, the projection of the silicon oxide film substrate had a height of 1 μm, a width of 1 μm and a pitch of 3 μm. The thickness of the aluminum film on the projection was the same as in FIG. 8A.

Figure 9A:
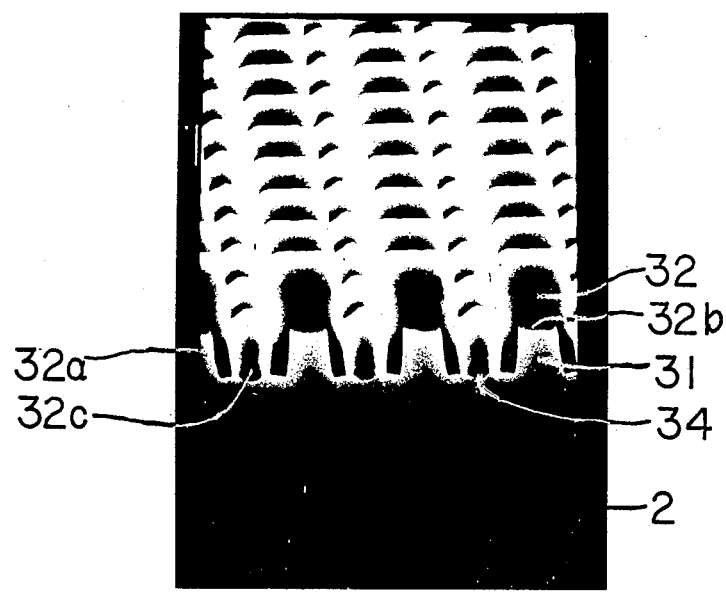

FIG. 9A shows a condition before charged particles are irradiated and has the same shape as in FIG. 8A.

Figure 9B:
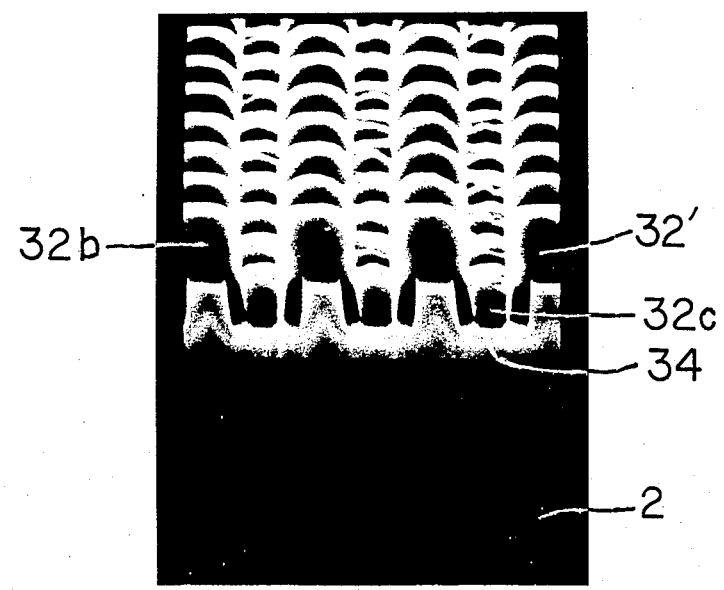

FIG. 9B shows a covering condition of the aluminum film 32' when charged particles were irradiated for two minutes. The aluminum film 32c on the bottom of the groove 34 which had a converging shape was planarized and the both edges of the aluminum film 32b on the projection 31 were slightly rounded.

FIG. 9C shows a shape after the irradiation for three minutes. The shape was not remarkably varied compared with the shape shown in FIG. 9B after the irradiation for two minutes.

FIG. 9D shows a shape after the irradiation for four minutes. The height of the aluminum film 32b on the projection 31 was decreased and the height of the aluminum film 32c on the bottom of the groove 34 was increased with an inclined surface. This inclination indicates that the aluminum film 32b on the projection 31 was fluidized and ran into the groove 34.

Figure 9E:
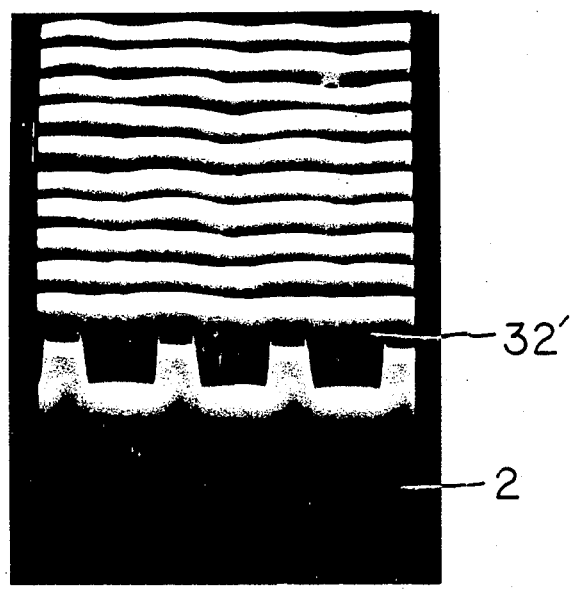

FIG. 9E shows a shape after the irradiation for five minutes. The surface of the aluminum film was satisfactorily planarized.

As clear from the above examples, the aluminum film on the projection suddenly flows into the groove for the first time after the radiation for a predetermined time. This indicates that a temperature of the substrate 2 rises due to the impingement of charged particles, so that the aluminum film was fluidized.

Figure 10A:
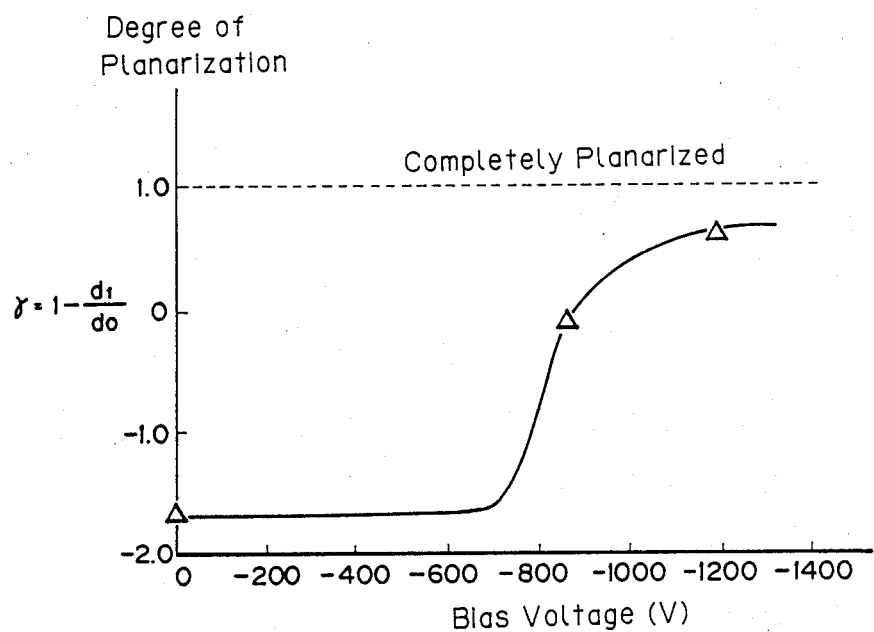
FIG. 10A illustrates a characteristic curve of a dependence of the degree of planarization on a bias voltage in the first embodiment of the present invention.
Figure 10B:
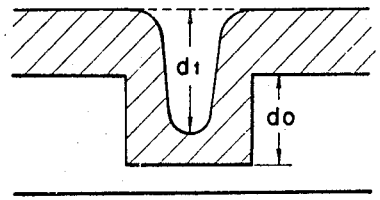
FIG. 10B is an explanatory diagram used to explain the definition of the term "degree of planarization"

FIG. 10A shows the dependence of a degree of planarization on the bias voltage. The degree of planarization is defined by $\gamma = 1 - (d_1/d_0)$, where $d_0$ is the height of a step-like projection, i.e., the depth of a groove of an undercoat (substrate) and $d_1$ is the depth of a recess formed on a surface of an aluminum film deposited on the substrate. When the surface of the aluminum film is completely planarized, $\gamma = 1$ and when the surface pattern of the aluminum film corresponds to the surface pattern of the undercoat or substrate, $\gamma = 0$. Furthermore, when $d_1$ is greater than $d_0$, the value of $\gamma$ becomes negative.

It is seen from FIG. 10A that when the absolute value of the bias voltage is substantially larger than $|-850|$ V (for example, $|-1200|$ V) when the apparatus of the type described above with reference to FIG. 5 is used, it becomes possible to obtain a highly planarized aluminum film which does not reflect the step portions of the surface pattern of the undercoat or substrate. The upper limit of the bias voltage is a bias voltage value immediately before an aluminum film reaches a temperature (melting point) at which an aluminum film starts to melt.

Next, substantial differences between the present invention and the conventional bias sputtering process will be briefly described. As described above, the conventional bias sputtering process utilizes etching phenomenon. On the other hand, according to the present invention, even though the aluminum film 32 is more or less etched when a bias voltage is applied to the substrate, the etching rate is extremely low. For instance, with the bias voltage of −850 V, the etching rate is about 200 Å/min and with the bias voltage of −1200 V, the etching rate is about 300 Å/min. Thus, within such a short time interval as described above, it is impossible to recede to planaraze the aluminum film 32b on the top of the projection 31 having a width of 2.5 μm. For instance, even if the aluminum film 32b is receded, no aluminum is supplied by the sputtering process, so that it cannot be explained why the aluminum film 32c which converges upwardly in the groove 34 as shown in FIG. 8A becomes uniformly planarized as shown in FIG. 8B.

According to the present invention, the aluminum film 32 is irradiated with charged particles so that the temperature of the aluminum film rises. In addition, due to the bombardment of the surface of the aluminum film with the accelerated charged particles, the aluminum film is fluidized to fill in the groove so as to planarize the surface of the aluminum film as shown in FIGS. 8B and 8C.

It should be noted that according to the present invention, the temperature rise of the aluminum film caused by the irradiation of the charged particles must be less than a melting point of the aluminum film. For instance, at the bias voltage of −850 V, the temperature rise was about 380° C. and at the bias voltage of −1200 V, the temperature rise was about 410° C.

As described above, the bombardment of the surface of the aluminum film with the charged particles plays an important role in the present invention and the reason was cleared as a result of extensive studies and experiments conducted by the inventors as follows.

FIG. 11 shows conditions of the aluminum film when the specimen as shown in FIG. 8A is turned upside down and the rear surface thereof is irradiated with the charged particles under the same condition as in FIG. 8C. When the rear surface of the substrate is irradiated with the charged particles at the bias voltage of −1200 V, the temperature rises substantially to the same level as the temperature as shown in FIG. 8C, but the coverage of the aluminum film is substantially similar to that as shown in FIG. 8A and is not improved.

When heat dissipation is caused by thermal radiation from the substrate, there exists no temperature difference between the top and rear surfaces of the substrate as disclosed in Journal of Vacuum Science Technology Vol. 11 (1974), pp. 1177–1185. In view of the above, the temperature per se is not an essential requirement to cause the fludization of the aluminum film and the above-described fact shows that the bombardment of the surface of the thin film with the charged particles is also required in order to realize the effects of the present invention.

In the above-described first embodiment of the present invention, the substrate is not positively heated from the exterior. It is of course possible to irradiate the surface of a thin film with the charged particles while the substrate is heated from the exterior by means of a heater or an infrared lamp. As compared with the case in which the substrate is not heated from the exterior, the aluminum film is easily fluidized when the substrate is heated from the exterior, so that the bias voltage required for obtaining the corresponding degree of planarization can be remarkably decreased. However, in this case, it is required that the temperature rise due to the irradiation of the charged particles and the external heating does not exceed a melting point of the aluminum film.

While in the first embodiment, the step for depositing an aluminum film and the step for irradiating charged particles to the aluminum film are sequentially and continuously processed, the steps can be processed separately, since the steps are independent of each other. For instance, the depositing step of the aluminum film can be processed in a different vacuum chamber or by employing a different deposition method such as vacuum evaporation method, chemical vapor deposition method. In addition, a further step such as a patterning step of the aluminum film can be processed between the above-described two steps, without any hindrance to embody the present invention.

Next, a second embodiment of the present invention will be described. According to the second embodiment, while an aluminum film is being formed, its surface is planarized. A substrate having a convex and concave surface is mounted in the vacuum chamber 1 and an argon gas or the like is introduced into the vacuum chamber 1. While a high frequency power of, for instance, 13.56 MHz is applied to the substrate electrode 23 from the power supply 5 and charged particles are irradiated to the substrate 2, the sputter gun 21 is energized to sputter the aluminum target 3, so that an aluminum film is formed on the rough surface of the substrate 2.

FIGS. 12A-12D show the coverage shape of the aluminum thin film which was formed upon the surface of a silicon dioxide film having projections 40 having a width of 1.0 μm, a height of 1.0 μm and a pitch of 3.5 μm while the bias voltage of −850 V was applied to the substrate 2. While the film formation period is short, the temperature rise is not sufficient so that the coverage of the aluminum film 41 is not satisfactory, even though the coverage is not so worse as shown in FIG. 8A.

Thereafter, the deposition of the aluminum film 41 is further proceeds, while the same bias voltage is maintained. Then, the aluminum film 41 is gradually fluidized because of the temperature rise of the substrate 2 and the bombardment of the surface of the growing aluminum film 41 with the charged particles as described above in the first embodiment. As a result, as shown in FIGS. 12B-12D, the aluminum film 41 completely fills in the grooves 42 and the surface of the aluminum film 41 is planarized.

As described above, according to the second embodiment of the present invention, even though the absolute value of the bias voltage is as low as −850 V as compared with the first embodiment, the surface of the aluminum film is planarized because the temperature of the substrate rises due to the impingement of the sputtered atoms thereon. In this case, the temperature of the substrate was about 450° C.

FIGS. 12A-12D show how the degree of planarization of the aluminum film formed under the same bias voltage condition is improved according to processing time period. It is confirmed that similar improvement can be attained at different bias voltages according to the results of the studies and experiments conducted by the inventors.

Figure 13:
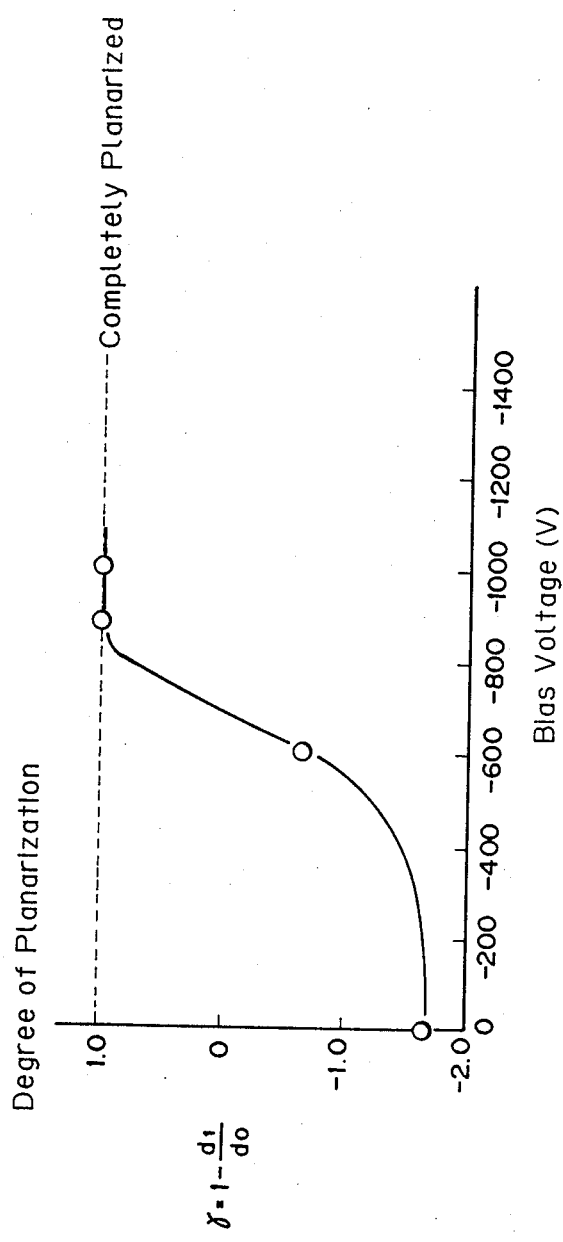
FIG. 13 is a diagram illustrating the dependence of a degree of planarization of an aluminum film upon a bias voltage in the second embodiment of the present invention.

FIG. 13 shows the dependence of the degree of planarization upon the bias voltage. It is seen that when the bias voltage has an absolute value greater than $|-700|$ V, the degree of planarization is improved and especially when the bias voltage has an absolute value greater than $|-800|$ V, the surface of the deposited aluminum film is so planarized that the convex and concave portions of the surface are almost zero. In this case, the upper limit of the bias voltage must be so determined that the temprature of the aluminum film does not exceed a level at which the aluminum film is melted.

Figure 14:
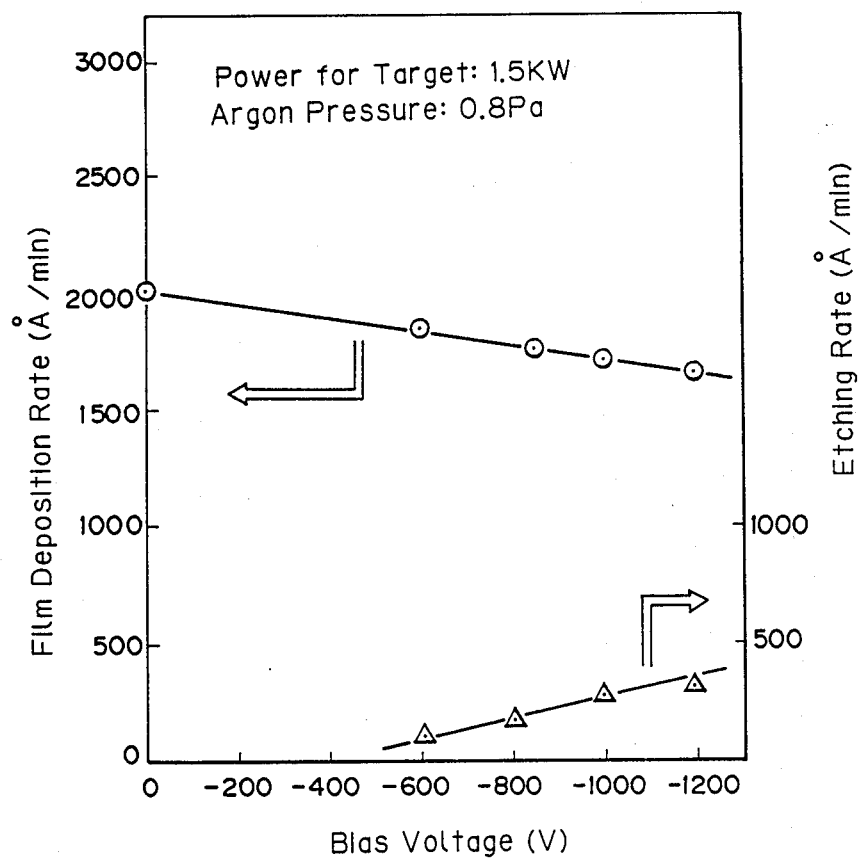
FIG. 14 is a diagram illustrating the dependence of a film deposition rate and an etching rate upon a bias voltage in the second embodiment of the present invention.

One of the greatest differences between the second embodiment of the present invention and the prior art bias sputtering process resides in the fact that a ratio R of (etching rate)/(film formation rate) is substantially different. According to the conventional bias sputtering process, planarization due to etching is utilized, so that the above-described literature concerning the bias sputtering process reports that the condition $R > 0.4$ must be satisfied. In order to satisfy this condition, the film formation rate must be limited to a low value. On the other hand, according to the present invention, as shown in FIG. 14, $R = 0.05$ is obtained when the bias voltage is −600 V at which the fluidization of the aluminum film occurs, and $R = 0.1$ is obtained when the bias voltage is −850 V at which the surface of the aluminum film is completely planarized. The difference in R between the present invention and the conventional bias sputtering process means that the planarization of the surface of the aluminum film according to the present invention is based upon the principle completely different from that of the conventional bias sputtering process.

FIG. 14 also shows the fact that the planarized aluminum film can be formed within a short period of time as compared with the conventional bias sputtering process, since the film deposition rate attained by the method of the present invention is greater than the etching rate. In this example of the present invention, the film deposition rate was about 200 nm/min, while in the prior art bias sputtering process, the film deposition rate is of the order of 20 nm/min. That is, the film deposition rate of the present invention is about ten times as fast as that of the conventional bias sputtering process.

In the second embodiment, as in the case of the first embodiment, the substrate can be heated from the exterior by means of a heater or an infrared lamp. In this case, the external heat facilitates the fluidization of the aluminum film, so that a satisfactorily planarized surface of the deposited film can be ensured.

A third embodiment of the present invention will be explained. According to the third embodiment, after the first step of forming an aluminum film of a predetermined thickness over a convex and concave surface of a substrate while no bias voltage is applied to the substrate, an aluminum target is sputtered in the second step, while a bias voltage is applied to the substrate and charged particles are irradiated to the substrate to from a new aluminum film over the aluminum film previously deposited.

Figure 15:
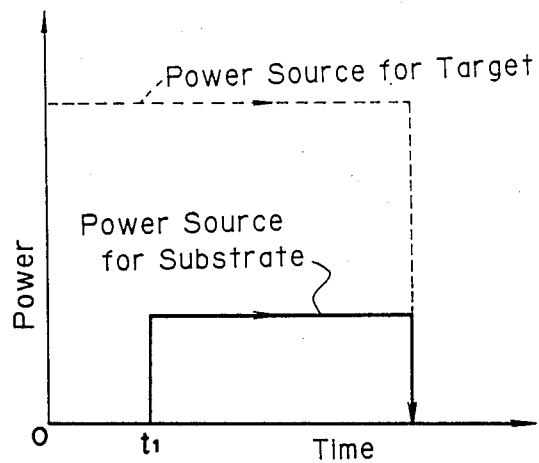
FIG. 15 is a timing chart illustrating a relationship of power inputs between a target power supply and a substrate power supply.

An embodiment including these steps will be explained. FIG. 15 shows time variations in powers applied to the substrate 2 and the target electrode 3.

Here, the substrate 2 is arranged in the vacuum chamber 1 and the target power source 4 is turned on in FIG. 4. Then, the shutter 10 is opened to form an aluminum film on the substrate in the first step. Subsequently, the bias power source 5 is turned on at a time $t_1$ after the shutter 10 is opened, so that the new aluminum film is deposited on the first aluminum film while charged particles are irradiated to the substrate in the second step.

Figure 16:
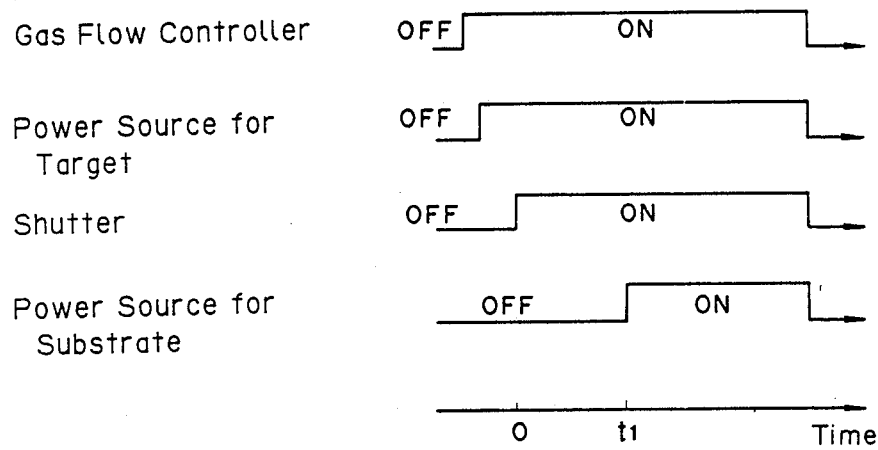
FIG. 16 is a timing chart used to explain the mode of operation of a sequence controller.

The powers applied to the substrate 2 and the target 3 can be manually controlled, but they can be controlled more precisely in response to the control signals from the sequence controller 8. In the latter case, the instrument controller Model 1720A, a product of Fluke Corp., may be used as the sequence controller 8 so as to accomplish the sequence control in accordance with a timing chart as shown in FIG. 16.

The thin film which has been deposited during the deposition period in the first step until the time $t_1$ has a high purity without including any materials constituting the substrate 2, since no RF or DC bias voltage is applied to the substrate 2. The subsequent deposition is performed in the second step while the bias voltage is applied and the charged particles are irradiated, so that the thin film which has been deposited on the substrate 2 in the first step is subjected to the etching action. As a result, there is the possibility that the materials etched from the previously deposited film is mixed into a newly deposited thin film. However, the previously deposited thin film itself consists of high purity substances constituting the target electrode 3, so that the purity of the newly deposited thin film is not adversely affected. In addition, the direct bombardment by the ions against the surface of the substrate 2 is avoided, so that the surface of the substrate 2 is less damaged.

While in the embodiment the first and the second steps are processed by using the same target, the same effects can be expected by depositing the first film by using a different target or a different depositing apparatus.

Figure 17:
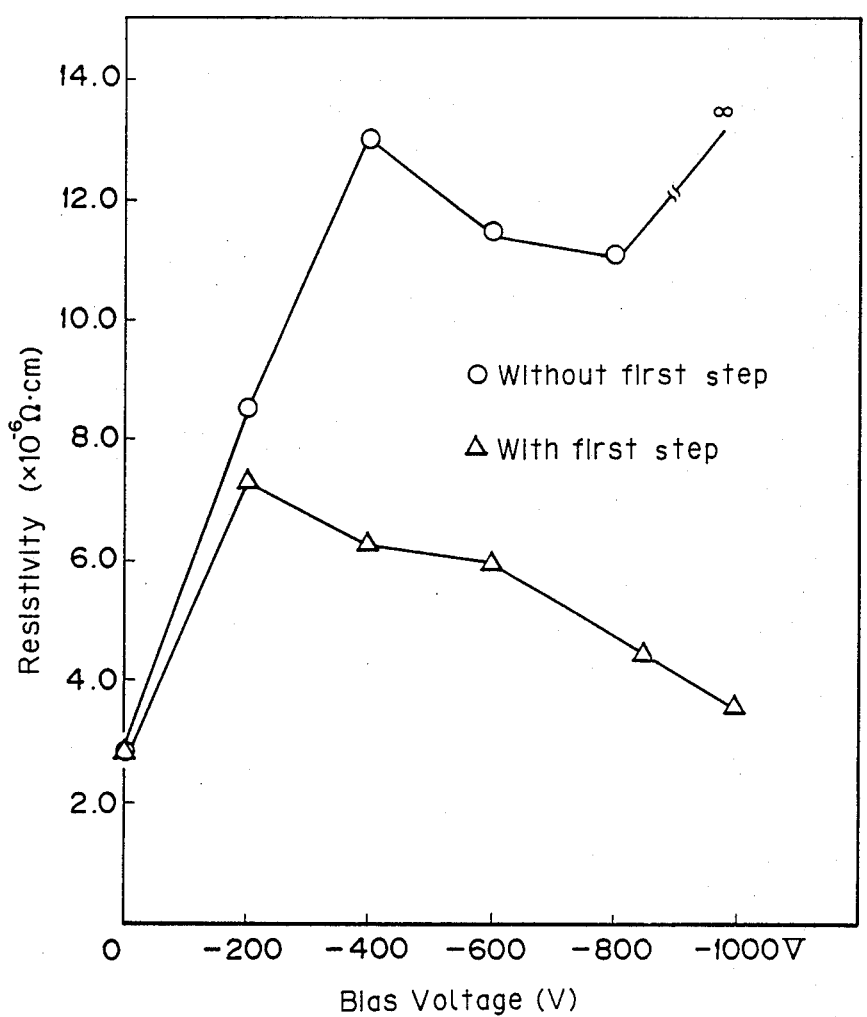
FIG. 17 illustrates a relationship of a resistivity of an aluminum film with bias voltage.

FIG. 17 illustrates a voltage dependence of resistivity of an aluminum film deposited by using this embodiment in comparison with the process without the first step. Here, silicon dioxide was used as the substrate 2. The film thickness of the film deposited in the first step was 300 nm. The total film thickness, i.e., the sum of the film thickness in the first step and the thickness in the second step was fixed to 1 $\mu$m, regardless of the exisistence of the first step. The pressure of the Ar gas was 0.8 Pa and the temperature of the substrate was room temperature. When an absolute value of the bias voltage is equal to or higher than 400 V, the resistivity of the alumnum film in case of the process with the first step ($\Delta$ mark) is lowered to ½ through ⅓ of the resistiviting in case of the process without the first step (O mark). Accordingly, a quality of the deposited film is greatly improved in the former case with the first step.

Figure 18:
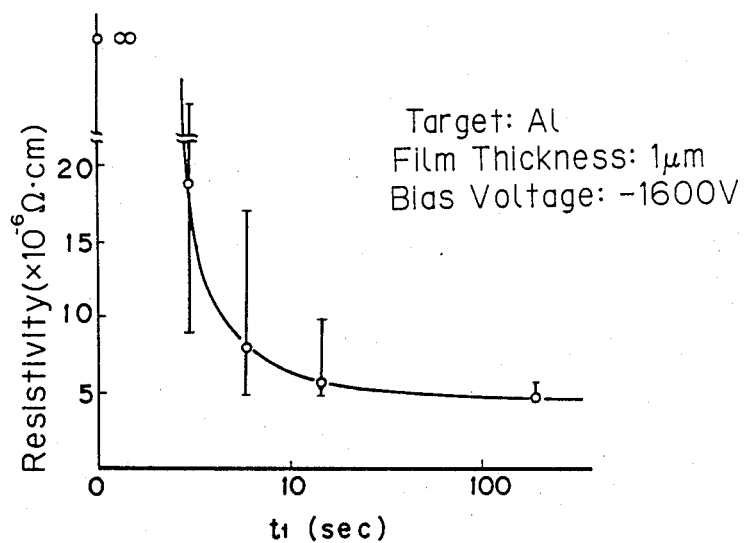
FIG. 18 illustrates a time-resistivity characteristic curve of a variation in resistivity of an aluminum film with respect to time $t_1$.

FIG. 18 shows the relationship between the time $t_1$ and the resistivity of the aluminum film in an extreme case that the aluminum film was formed by applying a bias voltage of $-1600$ V and irradiating charged particles. When the time $t_1$ is 0; that is, when a bias voltage is applied to the substrate from the start of the deposition step, the resistivity of the aluminum film deposited on the substrate becomes infinite. In this case, the surface condition of the aluminum film is as shown in FIG. 3. It is seen from the scanning type electron microscope photograph shown in FIG. 3 that the crystal grains are grown with the crystals being spaced apart from each other. When the time $t_1$ is elongated to 3, 6, 15 and 200 seconds, the resistivity is decreased gradually and the variations in resistivity are reduced.

Figure 19:
FIG. 19 is a photograph taken by a scanning type electron microscope and illustrating the surface of an aluminum film formed by the bias sputtering process when time $t_1 = 60$ sec.

FIG. 19 is a scanning electron microscope photograph illustrating the surface of the aluminum film when the time $t_1$ was 60 seconds. It is seen from FIG. 19 that the deposited aluminum film has a uniform and smooth surface. When the time $t_1$ is too long, the thickness of the thin film which has been deposited on the substrate 2 without applying any bias voltage thereto is increased. As a result, when the deposition is further continuously proceeds while charged particles are irradiated to the substrate until a desired thickness of the deposited film is obtained, it becomes impossible to obtain a planarized surface shape with a satisfactory degree of coverage.

Figure 20:
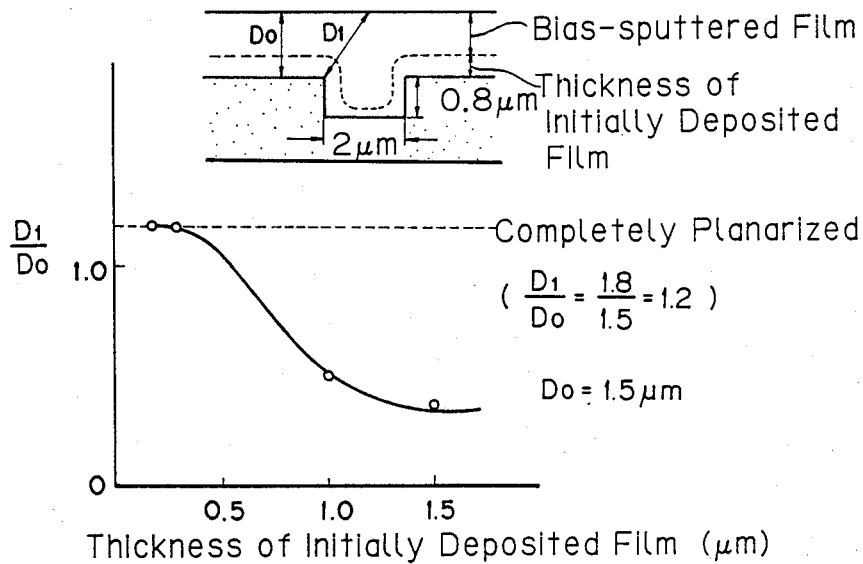
FIG. 20 shows a characteristic curve illustrating the relationship between the initial film thickness and the step coverage when the whole film thickness is 1.5 $\mu m$.

FIG. 20 shows the relationship of $D_1/D_0$ with a thickness of a initially deposited film, where $D_0$ is an overall film thickness (a thickness of the initially deposited film + a thickness of the following thin film formed by applying a bias) and $D_1$ is the distance between one upper edge of the step and a position of the surface of the thin film intersecting with the center line of the step, in case that a first film is deposited with a various thickness on a step having a width of 1 $\mu$m and a depth of 0.8 $\mu$m without applying a bias voltage to the substrate for the time period of $t_1$ and subsequently a second film is deposited with applying a bias voltage of $-850$ V to the substrate while irradiating charged particles to the deposited film to obtain the overall film thickness $D_0$ of 1.5 $\mu$m.

It is seen from FIG. 20 that the thicker the thickness of the initially deposited film (that is, the thickness of the thin film deposited during the time period $t_1$), the worse the step coverage becomes; that is, the less the ratio $D_1/D_0$ becomes.

Figure 21:
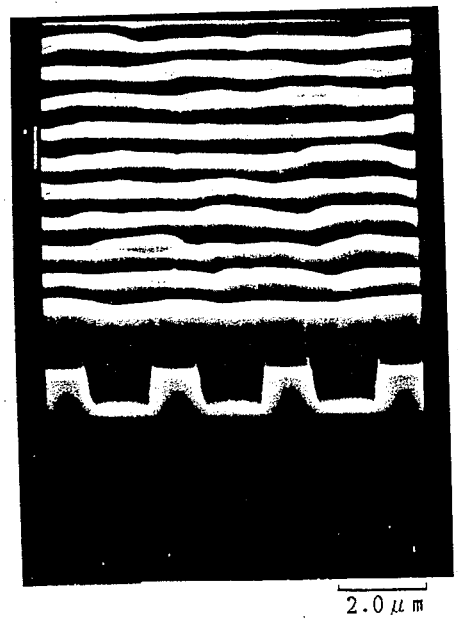
FIG. 21 is a photograph taken by a scanning type electron microscope and illustrating the cross section of an aluminum film formed by bias sputtering on a substrate having grooves with a depth of 0.8 $\mu m$ and a line-and-space of 1.0 $\mu m$–1.5 $\mu m$.

FIG. 21 shows a scanning electron microscope photograph illustrating an aluminum film deposited over the surface of the substrate having grooves of line-and-space of 1.0 $\mu$m-1.5 $\mu$m and a depth of 0.8 $\mu$m when the time $t_1$ is suitably selected according to the method of the present invention and using the apparatus of the type described above. It is seen from this photograph that aluminum is completely embedded into the grooves and the film with a high degree of coverage is formed.

As described above, when the time $t_1$ is suitably selected and the film formation steps are highly precisely controlled by the sequence controller 8, it becomes possible to deposit a high quality thin film whose surface is planarized and which has a low resistivity. In addition, the thin film gives less damage to the surface of the substrate and has a uniform and good step coverage.

When the deposited films are grown in the form of islands in the first step in which elements constituting the target are deposited on the surface of a substrate to which a negative potential is not applied, the substrate materials which have been sputter-etched out by irradiating charged particles in the second step are mixed into the deposited film, so that the purity of the deposited film is lowered. As result, it is desirable that the film to be formed in the first step is such a continuous film as to cover the surface of the substrate.

Figure 22:
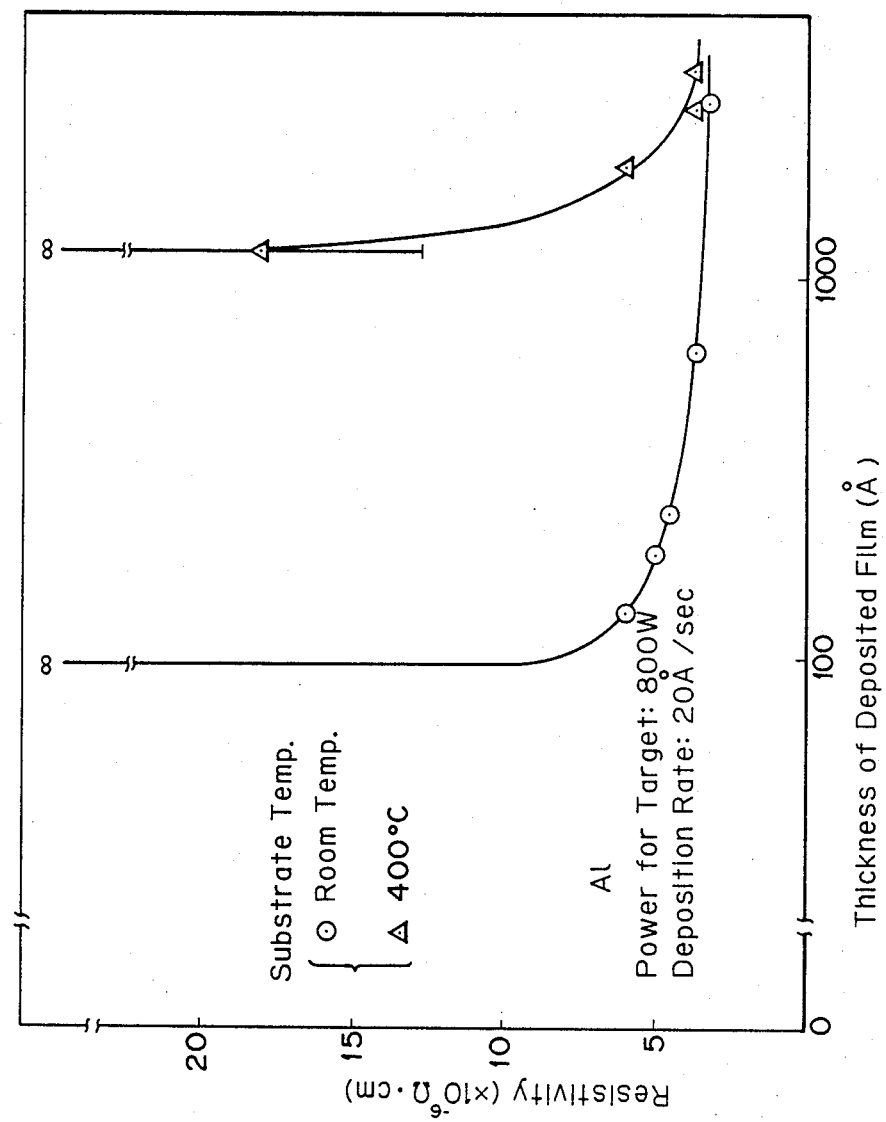
FIG. 22 illustrates characteristic curves representative of the relationship between the thickness of a deposited film and its resistivity

Next referring to FIG. 22, conditions that a initially deposited film is a continuous film will be described in the case of an aluminum film. As shown in FIG. 22, when the substrate is maintained at room temperature with the target power of 800 W and the deposition rate of 20 Å/sec, a continuous film having a low resistivity can be formed if the thickness of the initially deposited aluminum film is greater than about 130 Å. It follows therefore that the thickness of the initially deposited film in the first deposition step is preferably thicker than about 130 Å. On the other hand, when the temperature of a substrate is maintained at 400° C., continuous film can be formed if the thickness of the aluminum film is equal to 2000 Å or more. If the thickness is less than about 2000 Å, island-like film is formed and has a high resistivity.

As described above, the thickness of the film required for forming a continuous film varies depending upon a temperature of a substrate. Therefore, if the deposition time period is suitably determined depending upon whether the substrate is maintained at room temperature or is heated, an aluminum film can be deposited to have a thickness required for forming a continuous film. In addition, when the target materials and/or the target power are changed, the thickness of the film required for forming a continuous film can also be varied.

As described above, according to the third embodiment of the present invention, the sputtered elements constituting the target are deposited upon the surface of the substrate to which a bias voltage is not applied and then the elements constituting the target are further deposited on the surface of the substrate by using the fluidization phenomenon while a negative bias voltage is applied to the substrate. Therefore, the materials of the substrate can be prevented from being mixed into the deposited thin film and even when the surface of the substrate is convex and concave, a planar, uniform thin film can be deposited with excellent coverage and without causing any undesirable damage to the surface of the substrate. As a result, it becomes possible to obtain a highly reliable conductor wiring without any disconnection at a step even for a multi-layer wiring of a wiring pattern, in a semiconductor integrated circuit.

So far the present invention has been described in connection with the embodiment of aluminum film, but it is to be understood that the present invention may be equally applied to a case of planarization of the surface of an aluminum alloy film containing a small amount of one or more elemens such as Si, Cu or the like. In addition, the present invention may be equally applied to a thin metal film material other than aluminum. While the substrate has been described as consisting of silicon dioxide, it is to be understood that the present invention may be equally applied to other materials of a substrate of LSI device. As the substrate material, single-crystal silicon, polycrystal silicon, silicon dioxide, silicon nitride or the like are used in general and Ti, Mo, W or compounds thereof can be used.

As described above, the present invention is not based upon an etching phenomenon, but is mainly based up on the fluidization phenomenon of a thin film already formed or being formed. Due to the fluidization of an aluminum film, grooves are filled with the fluidized aluminum film so that the surface of the aluminum film is planarized. As a result, the aluminum film coverage immediately after the formation of the aluminum film or in the initial stage of the formation of the aluminum film is improved and thus wiring defects such as disconnections can be minimized. Consequently, the yield of semiconductor integrated circuits can be improved.

In addition, a period of time required for causing the fluidization of an aluminum film is shorter than a period of time required for the disappearance of inclined surface caused by etching phenomenon. Therefore, a planarized thin film can be formed within a short time as compared with the conventional bias sputtering process. Moreover, the substrate can be externally heated, so that the film deposition rate can be further increased. Since the present invention utilizes the fluidization phenomenon of a thin film such as an aluminum film, so that the surface of a deposited thin aluminum film can be planarized independently of the surface pattern of an undercoat or substrate.

In the first and third embodiments of the present invention, an aluminum film is previously formed without applying any bias voltage to a substrate, so that, in the succeeding step including the irradiation of charged particles, the substrate is prevented from being sputtered. Consequently, a quality of the deposited film is improved and a continuous film can be formed. Furthermore, damages to the surface of the substrate due to the bombardment of the charged particles can be minimized.

What is claimed is:

1. A method for forming a planarized aluminum or aluminum alloy film, comprising the steps of:
   forming an aluminum or aluminum alloy film on a substrate having a surface including convex portions and concave portions; and
   irradiating charged particles accelerated by a bias voltage having an absolute value greater than 850 volts over said film so that said film is fluidized by a temperature rise of said film and bombardment of said film with said charged particles, and said temperature of said film is less than the melting point of said film.

2. A method for forming a planarized film as claimed in claim 1, wherein after the formation of said film on said substrate, said charged particles are irradiated on said film after said substrate has been heated from the exterior or while said substrate is being heated from the exterior.

3. A method for forming a planarized film as claimed in claim 2, wherein a temperautre of said film in case of the irradiation with said charged particles and the heating from the exterior is less than a melting point of said film.

4. A method for forming a planarized aluminum or aluminum alloy film on a substrate having a surface including convex portions and concave portions, said method comprising the steps of:
   irradiating charged particles accelerated by a bias voltage having an absolute value greater than 700 volts on said aluminum or aluminum alloy film which is being formed; and
   forming said film while fluidizing said film by a temperature rise of said film and bombardment of said film with said charged particles, and said temperature of said film is less than the melting point of said film.

5. A method for forming a planarized film as claimed in claim 4, wherein said substrate is heated from the exterior when said film is formed on said substrate.

6. A method for forming a planarized film as claimed in claim 5, wherein a temperature of said film in case of the irradiation with said charged particles and the heating from the exterior is less than a melting point of said film.

7. A method for forming a planarized aluminum or aluminum alloy film, comprising:
   a first step of forming a first aluminum or aluminum alloy film on a substrate having a surface including convex portions and concave portions; and
   a second step of forming a second aluminum or aluminum alloy film on said first film while irradiating said second film with charged particles accelerated by a bias voltage having an absolute value greater than 700 volts, a temperature of said second film being less than the melting point of said second film during the formation of said second film.

8. A method for forming a planarized film as claimed in claim 7, wherein a thickness of said first film deposited in said first step is such that said first film is deposited as a continuous film.

9. A method for forming a planarized film as claimed in claim 7, wherein said second film is formed while said second film is fluidized by a temperature rise of said second film and by bombardment of said second film with said charged particles.

10. A method for forming a planarized film as claimed in claim 7, wherein said substrate is heated from the exterior in said second step.

11. A method for forming a planarized film as claimed in claim 10, wherein a temperature of said second film in cases of the irradiation with said charged particles and the heating from the exterior is less than a melting point of said second film.

* * * * *